US009579763B2

(12) United States Patent
Hosaka

(10) Patent No.: US 9,579,763 B2
(45) Date of Patent: Feb. 28, 2017

(54) MACHINE TOOL

(75) Inventor: Akio Hosaka, Kanagawa (JP)

(73) Assignee: SODICK CO., LTD., Kanagawa (JP)

(*) Notice: Subject to any disclaimer, the term of this patent is extended or adjusted under 35 U.S.C. 154(b) by 463 days.

(21) Appl. No.: 14/110,711

(22) PCT Filed: Aug. 30, 2012

(86) PCT No.: PCT/JP2012/072084
§ 371 (c)(1),
(2), (4) Date: Oct. 9, 2013

(87) PCT Pub. No.: WO2013/031927
PCT Pub. Date: Mar. 7, 2013

(65) Prior Publication Data
US 2014/0033854 A1 Feb. 6, 2014

(30) Foreign Application Priority Data
Aug. 30, 2011 (JP) ................................ 2011-186991

(51) Int. Cl.
*B23Q 16/00* (2006.01)
*G03F 7/20* (2006.01)
(Continued)

(52) U.S. Cl.
CPC ............. *B23Q 16/00* (2013.01); *B23Q 1/621* (2013.01); *B23Q 5/28* (2013.01); *G03F 7/70716* (2013.01);
(Continued)

(58) Field of Classification Search
CPC . B23Q 16/00; G03F 7/70716; G03F 7/70758; G03F 7/70725; G03F 7/70775; G03F 7/709
(Continued)

(56) References Cited

U.S. PATENT DOCUMENTS 5,717,482 A * 2/1998 Akutsu ............... G03F 7/70716
355/53
6,028,376 A * 2/2000 Osanai ................ G03F 7/70716
310/12.13
(Continued)

FOREIGN PATENT DOCUMENTS

JP 61-117034 * 6/1986
JP S61-117034 6/1986
(Continued)

OTHER PUBLICATIONS

"International Search Report (Form PCT/ISA/210)", mailed on Sep. 25, 2012, with English translation thereof, p. 1-p. 3.

Primary Examiner — Larry E Waggle, Jr.
Assistant Examiner — Mahdi H Nejad
(74) Attorney, Agent, or Firm — Jianq Chyun IP Office

(57) ABSTRACT

A machine tool including: a table disposed on a saddle movable along an X-axis; a pair of linear motors that moves the table along a Y-axis; position detectors that detect a first position and a second position of the table on the Y-axis; a pair of guide rails attached to the saddle; and four bearings engaged with the pair of guide rails, is provided. The machine tool includes a connecting unit connecting the table to the four bearings such that the table is rotatable relative to the four bearings, and a control unit that controls the pair of linear motors on the basis of the first and second positions.

13 Claims, 13 Drawing Sheets

(51) Int. Cl.
*B23Q 1/62* (2006.01)
*B23Q 5/28* (2006.01)

(52) U.S. Cl.
CPC ...... *G03F 7/70725* (2013.01); *G03F 7/70758* (2013.01); *G03F 7/70775* (2013.01); *Y10T 74/20354* (2015.01)

(58) Field of Classification Search
USPC .............. 269/73; 74/490.9, 471.01, 471 XY, 74/490.07, 490.08, 490.13; 355/53, 72, 355/75; 310/10
See application file for complete search history.

(56) References Cited

U.S. PATENT DOCUMENTS

| | | | | |
|---|---|---|---|---|
| 6,072,183 A * | 6/2000 | Itoh | ............... | G03F 7/70716 250/442.11 |
| 6,082,010 A * | 7/2000 | Lee | ............... | B23Q 1/38 269/73 |
| 6,174,102 B1 * | 1/2001 | Do | ............... | B23Q 1/282 269/71 |
| 6,677,691 B2 | 1/2004 | Ebihara | | |
| 7,282,874 B2 * | 10/2007 | Shibata | ............... | H02K 41/03 108/137 |
| 7,361,910 B2 * | 4/2008 | Ono | ............... | G03B 27/42 250/492.2 |
| 7,372,231 B2 * | 5/2008 | Sako | ............... | G05B 19/19 318/623 |
| 7,508,646 B2 * | 3/2009 | Emoto | ............... | G03F 7/707 361/230 |
| 7,997,567 B2 * | 8/2011 | Nakajima | ............... | G03F 7/70716 269/57 |
| 8,104,752 B2 * | 1/2012 | Eidelberg | ............... | G03B 27/58 108/140 |
| 2003/0098962 A1 * | 5/2003 | Kubo | ............... | G03F 7/70716 355/72 |
| 2004/0080727 A1 * | 4/2004 | Emoto | ............... | G03F 7/70858 355/30 |
| 2006/0187439 A1 * | 8/2006 | Korenaga | ............... | G03F 7/70758 355/72 |
| 2009/0059194 A1 * | 3/2009 | Kanaya | ............... | G03F 7/70775 355/53 |
| 2009/0152785 A1 * | 6/2009 | Komiya | ............... | G05B 19/4015 269/63 |
| 2010/0018950 A1 * | 1/2010 | Aoki | ............... | G03F 7/70716 216/41 |
| 2010/0250004 A1 * | 9/2010 | Makino | ............... | B23Q 1/621 700/275 |
| 2010/0266961 A1 * | 10/2010 | Kawamura | ............... | G03F 7/70716 430/319 |
| 2012/0057140 A1 * | 3/2012 | Aoki | ............... | G03F 7/70716 355/53 |
| 2013/0033123 A1 * | 2/2013 | Kubota | ............... | G03F 7/70758 310/12.06 |

FOREIGN PATENT DOCUMENTS

| | | | |
|---|---|---|---|
| JP | S61117034 A | * | 6/1986 |
| JP | 200122448 A | * | 1/2001 |
| JP | 2002328191 A | * | 11/2002 |
| JP | 2005332191 | * | 12/2005 |
| JP | 2003316440 A | * | 11/2013 |
| KR | 10-0570445 | | 4/2006 |
| KR | 100570445 | * | 4/2006 |

* cited by examiner

MACHINE TOOL

CROSS-REFERENCE TO RELATED APPLICATIONS

This application is a 371 application of an international PCT application serial no. PCT/JP2012/072084, filed on Aug. 30, 2012, which claims the priority benefit of Japan application no. 2011-186991, filed on Aug. 30, 2011. The entirety of each of the above-mentioned patent applications is hereby incorporated by reference herein and made a part of this specification.

BACKGROUND OF THE INVENTION

Field of the Invention

The invention relates to a machine tool for machining a work with a tool. In particular, the invention relates to a machine tool that includes a saddle, which is movable along a first axis, and a table, which is disposed on the saddle and movable along a second axis, wherein the first axis and the second axis are orthogonal to each other.

Description of Related Art

The known machine tool has a saddle that is carried by a bed and a table that is carried by the saddle. The saddle is movable along one of an X-axis and a Y-axis, which are orthogonal to each other, while the table is movable along the other axis. In this type of machine tool, guide rails are installed on the saddle, and the table is moved along the guide rails. However, due to the straightness error of the guide rails, undesirable yawing may occur on the table. Therefore, installation of the guide rails requires considerable expertise, and it is considered difficult to use long guide rails on this type of machine tool.

Patent Document 1 discloses disposing an additional rotary table on an XY table. The additional rotary table includes a drive unit. Although the additional rotary table can correct an angle error caused by yawing, it also complicates the structure of the machine. Patent Document 1 also discloses a method for detecting a yawing amount and correcting a position error in each direction of the X and Y axes.

PRIOR ART LITERATURE

Patent Document

Patent Document 1: Japanese Patent Publication No. 61-117034

SUMMARY OF THE INVENTION

Nevertheless, installation of the additional auxiliary rotary table that includes the drive unit may increase the size of the machine tool. Moreover, in order to measure the yawing amount and calculate the correction amount, the control of the machine tool also becomes more complex. Considering the above, the invention provides a machine tool that can correct yawing of the table with a simple structure.

The invention relates to a machine tool, which includes a saddle that is movable along a first axis; a table which is disposed on the saddle and movable along a second axis orthogonal to the first axis; a first linear motor installed at one side of a direction of the first axis and moving the table along the second axis; a second linear motor installed in parallel to the first linear motor with an interval therebetween at the other side of the direction of the first axis and moving the table along the second axis; a first position detector detecting a first position of the table in the second axis at the one side; a second position detector detecting a second position of the table in the second axis at the other side; a first guide rail installed at the one side of the saddle and extending in a direction of the second axis; a second guide rail installed at the other side of the saddle and extending in the direction of the second axis; at least a pair of first bearings engaged with the first guide rail; and at least a pair of second bearings engaged with the second guide rail.

The machine tool is characterized in including a connecting unit, which connects the table to the at least two first bearings and the at least two second bearings so that the table is rotatable relative to the at least two first bearings and the at least two second bearings, and a control unit, which controls the first linear motor based on the first position and controls the second linear motor based on the second position.

The control unit may include a target position computer, which generates a target position for the first linear motor and the second linear motor so as to make the first position and the second position consistent with each other.

The connecting unit may include a table base, which is attached to the at least two first bearings and the at least two second bearings, and a rotation bearing, which connects the table to a center of the table base in a rotatable way.

The connecting unit may include a flexible spacer, which connects the table to the at least two first bearings and the at least two second bearings in a rotatable way.

The flexible spacer may have a slit for bending the flexible spacer in the direction of the first axis.

The machine tool further includes a third bearing, which is disposed between the at least two first bearings and engaged with the first guide rail, and a fourth bearing, which is disposed between the at least two second bearings and engaged with the second guide rail. The connecting unit may include a fixing spacer which fixes the table to the third bearing and the fourth bearing.

The connecting unit may include a table base, which is attached to the at least two first bearings and the at least two second bearings, and a flexible spacer, which connects the table to the table base in a rotatable way.

The machine tool of the invention can correct the yawing of the table with a simple structure.

DESCRIPTION OF THE EMBODIMENTS

A machine tool of the first embodiment of the invention is described in detail hereinafter with reference to FIG. 1, FIG. 2, and FIG. 3. The machine tool 1 includes a bed 2, a saddle 3, and a table 4. The saddle 3 is movably carried by the bed 2 and is movable in an X-axis direction. The table 4 is carried by the saddle 3 and is movable in a Y-axis direction. In a horizontal XY plane, the Y-axis is orthogonal to the X-axis. The machine tool 1 further includes a machining head (not shown) above the table 4. The machining head is movable in a vertical Z-axis direction, and the Z-axis is orthogonal to the XY plane. Generally, a work is fixed on the table 4 and a tool is attached to the machining head.

Figure 3:
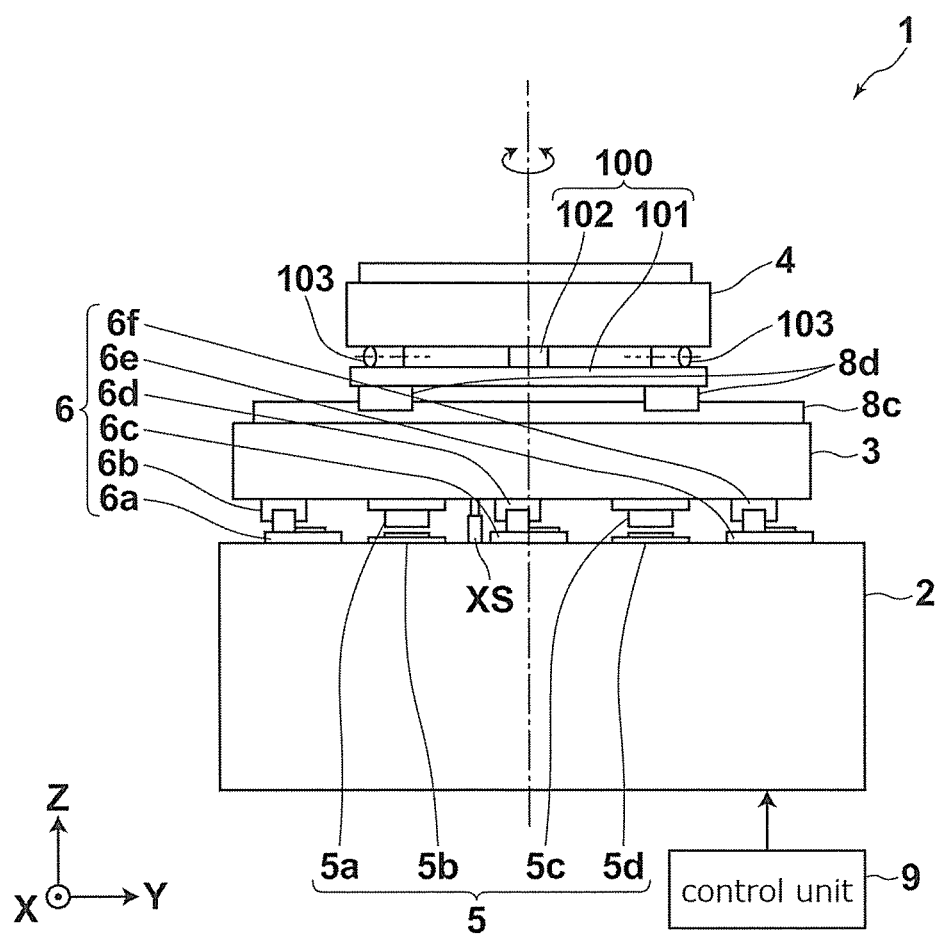
FIG. 3 is a schematic side view illustrating the machine tool of FIG. 1.

As illustrated in FIG. 3, an X-axis linear motor 5 and an X-axis guide 6 are installed between the bed 2 and the saddle 3. The X-axis linear motor 5 includes a pair of linear motors that extend in parallel along the X-axis and are separated by an interval. The pair of linear motors each includes a mover 5a, 5c and a stator 5b, 5d. The movers 5a and 5c are attached to a bottom surface of the saddle 3, and the stators 5b and 5d are attached to a top surface of the bed 2. A predetermined gap is formed between the movers 5a 5c and the stators 5b, 5d. The movers 5a and 5c include a plurality of coils and the stators 5b and 5d include a row of permanent magnets. When the coils of the movers 5a and 5c are excited, a thrust force is generated to move the saddle 3 along the X-axis.

The X-axis guide 6 is disposed for guiding the saddle 3 along the X-axis, and includes three guide rails 6a, 6c, and 6e that extend in parallel along the X-axis. The guide rails 6a, 6c, and 6e are installed on the top surface of the bed 2 and are respectively separated by an equal interval. The X-axis guides 6 include bearings 6b, 6d, and 6f that are slidably engaged with the guide rails 6a, 6c, and 6e respectively. The bearings 6b, 6d, and 6f are installed on the bottom surface of the saddle 3.

The bearing 6d is disposed in the center of the bottom surface of the saddle 3. The bearing 6d prevents the center of the saddle 3 from bending downward due to the load of the workpiece, table 4, and saddle 3. Preferably, the bearing 6d is arranged near the machining head in the center of the guide rails 6a and 6e if possible.

The machine tool 1 includes an X-axis linear encoder XS for detecting a position of the saddle 3 in the X-axis direction. The X-axis linear encoder XS includes a linear scale and an optical sensor for reading the linear scale. The linear scale is disposed on the top surface of the bed 2 and extends along the guide rail 6c in the X-axis. The optical sensor is installed nearly in the center of the bottom surface of the saddle 3. Otherwise, the X-axis linear encoder XS may include a magnetic scale and a Hall element which reads the magnetic scale.

Figure 2:
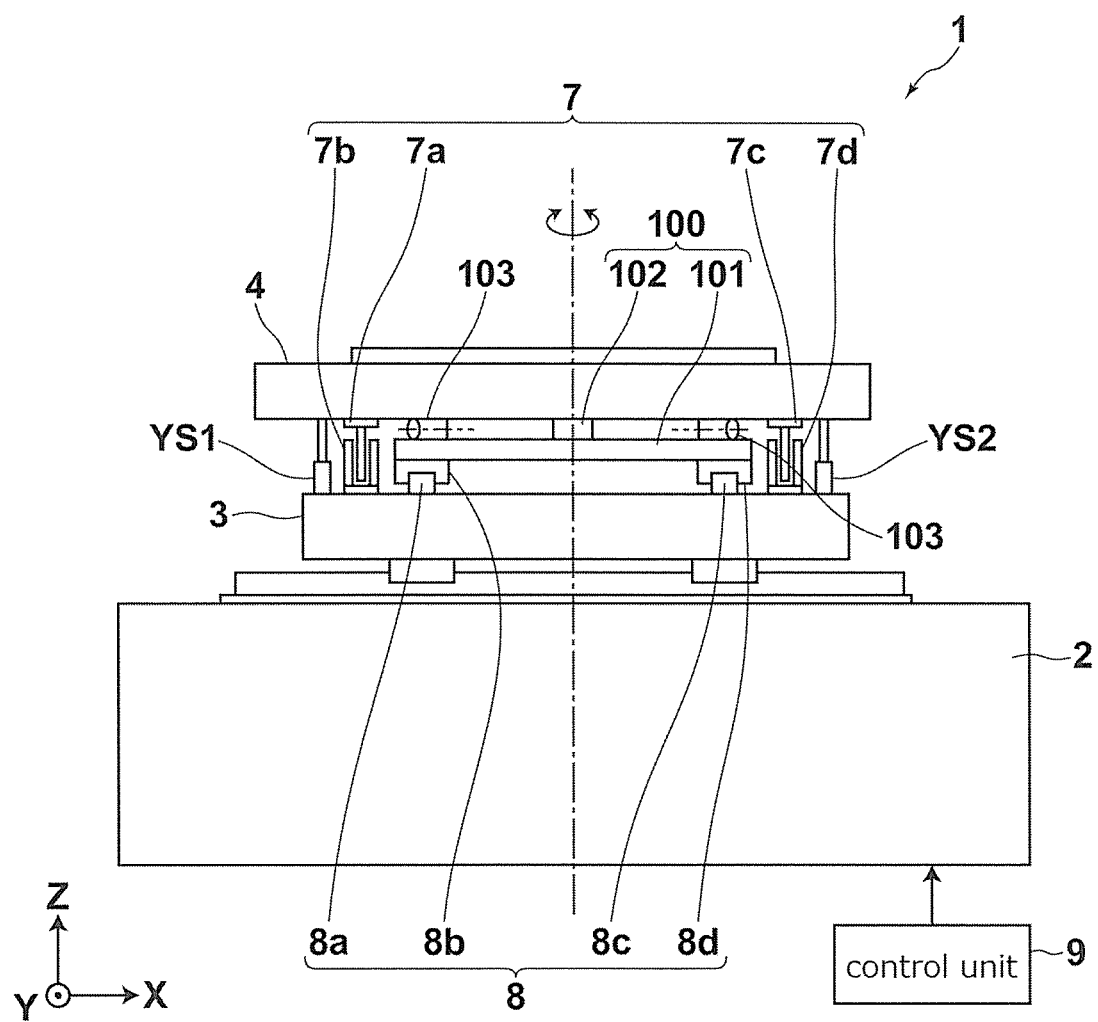
FIG. 2 is a schematic front view illustrating the machine tool of FIG. 1.

As illustrated in FIG. 2, a Y-axis linear motor 7 and a Y-axis guide 8 are installed between the saddle 3 and the table 4. The Y-axis linear motor 7 includes a pair of linear motors that extend in parallel along the Y-axis and are separated by an interval. The pair of linear motors each includes a mover 7a, 7c and a stator 7b, 7d. The movers 7a and 7c are attached to a bottom surface of the table 4, and the stators 7b and 7d are attached to a top surface of the saddle 3. A predetermined gap is formed between the movers 7a 7c and the stators 7b 7d. The Y-axis linear motor 7 has the same structures as the X-axis linear motor 5 and thus will not be repeated hereinafter.

The Y-axis guide 8 is disposed for guiding the table 4 along the Y-axis, and includes two guide rails 8a and 8c that extend in parallel along the Y-axis. The guide rails 8a and 8c are attached to the top surface of the saddle 3. The Y-axis guide 8 includes bearings 8b and 8d that are slidably engaged with the guide rails 8a and 8c respectively. The bearings 8b and 8d are connected to the bottom surface of the table 4 by a connecting unit 100. As shown in FIG. 1, the bearings 8b and 8d each include a pair of bearings.

The machine tool 1 includes Y-axis linear encoders YS1 and YS2 for detecting a position of the table 4 in the Y-axis direction. The Y-axis linear encoders YS1 and YS2 each include a linear scale and an optical sensor for reading the linear scale. The linear scales are disposed on the top surface of the saddle 3. The linear scale of the Y-axis linear encoder YS1 extends along the stator 7b in the Y-axis. The linear scale of the Y-axis linear encoder YS2 extends along the stator 7d in the Y-axis. The optical sensors are installed on the bottom surface of the table 4. The Y-axis linear encoders YS1 and YS2 may have the same structure as the X-axis linear encoder XS.

Below yawing of the table 4 is explained with reference to FIG. 4A and FIG. 4B. Here, it is given that the bearings 8b and 8d are attached to the bottom surface of the table 4 without the connecting unit 100. The solid lines in the figures indicate that the table 4 is located at the middle of a Y-axis stroke. The one-dot chain lines indicate a central line of the table 4. The two-dot chain lines indicate that the table 4 moves away from the middle of the Y-axis stroke.

Figure 4:
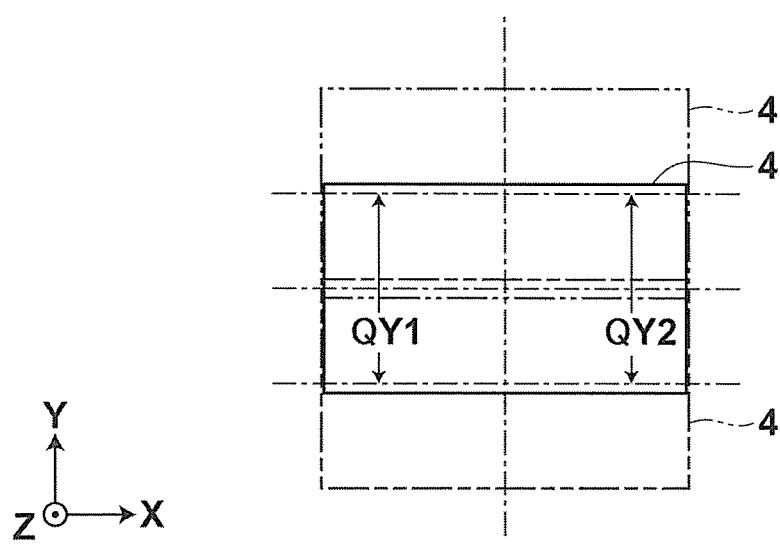
FIG. 4A is a schematic plan view illustrating a table that moves linearly in a Y-axis direction.
FIG. 4B is a schematic plan view illustrating the table that moves linearly in the Y-axis direction.
Figure 4:
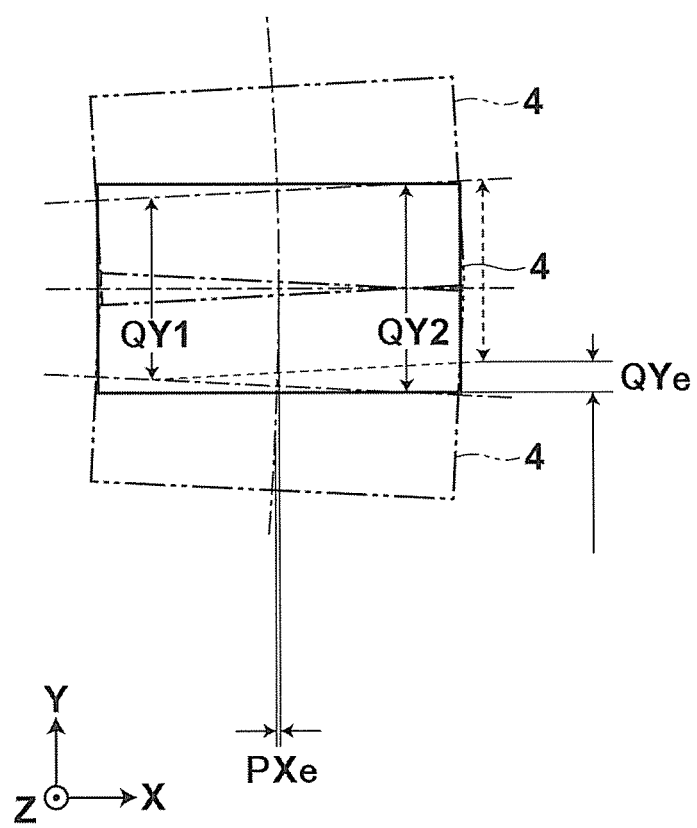

FIG. 4A depicts the table 4 that is guided by the guide rails 8a and 8c wherein a straightness error is 0. A reference numeral QY2 of FIG. 4A represents a movement amount of the table 4 in the figure at a right side, and a reference numeral QY1 represents a movement amount of the table 4 at the left side, wherein the right side and the left side of the table 4 have equal movement amounts in the Y-axis direction. In other words, yawing does not occur on the table 4.

FIG. 4B depicts the table 4 that is guided by the guide rails 8a and 8c wherein there is a certain straightness error. The table 4 has a yawing problem and the movement amounts of the table 4 at the right side and the left side are different. In FIG. 4B, a reference numeral QYe represents a difference of the movement amounts QY2 and QY1 of the table 4 at the right side and the left side. A reference numeral PXe represents a position error of the table 4 in the X-axis direction.

Figure 1:
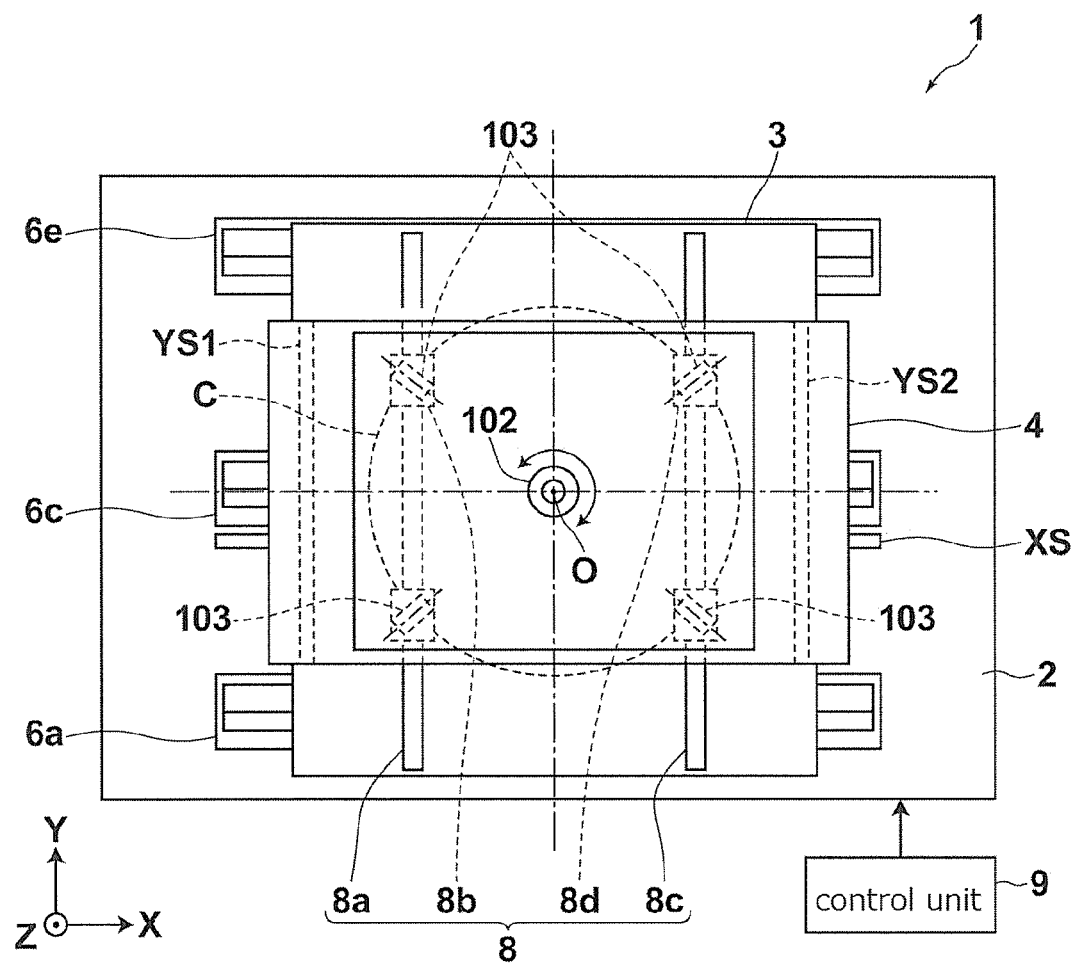
FIG. 1 is a schematic plan view illustrating a machine tool according to the first embodiment of the invention.

Referring to FIG. 1 through FIG. 3 again, in order to compensate the yawing of the table 4, the connecting unit 100 is used to connect the bearings 8b and 8d to the table 4. The connecting unit 100 includes a circular table base 101 and a rotation bearing 102 attached to the table base 101. The bearings 8b and 8d are disposed on a bottom surface of the table base 101.

As shown in FIG. 1, an outline of the table base 101 is represented by a circle C that passes the four bearings 8b and 8d. A center of the circle C is consistent with a center 0 of the table 4. The rotation bearing 102 is attached to the table base 101 in a way that a rotation axis thereof is coaxial to the Z-axis. The reference numeral O in FIG. 1 indicates the center of the table 4. The rotation bearing 102 is disposed at an inner side of the circle C. Preferably, the rotation bearing 102 is arranged coaxial to the center O if possible.

Through the rotation bearing 102, the table 4 is fixed in the X-axis direction. The table 4 is connected with the bearings 8b and 8d in a state that the table 4 is rotatable around the Z-axis that passes through the center O. The rotation bearing 102 includes an external wheel and a rotatable internal wheel. The external wheel is fixed to the table base 101, and the internal wheel supports an axis (not shown) that protrudes from the bottom surface of the table 4.

Four rollers 103 are installed on the top surface of the table base 101 to be rotated in a circumferential direction of the circle C. Preferably, the rollers 103 are arranged on the concentric circle C at equal distances. More preferably, the four rollers 103 are disposed right above the four bearings 8b and 8d so as to sandwich the table base 101. The rollers 103 disperse the load of the work and the table 4 onto the bearings 8b and 8d, so as to prevent the load from focusing on the rotation bearing 102.

Figure 5:
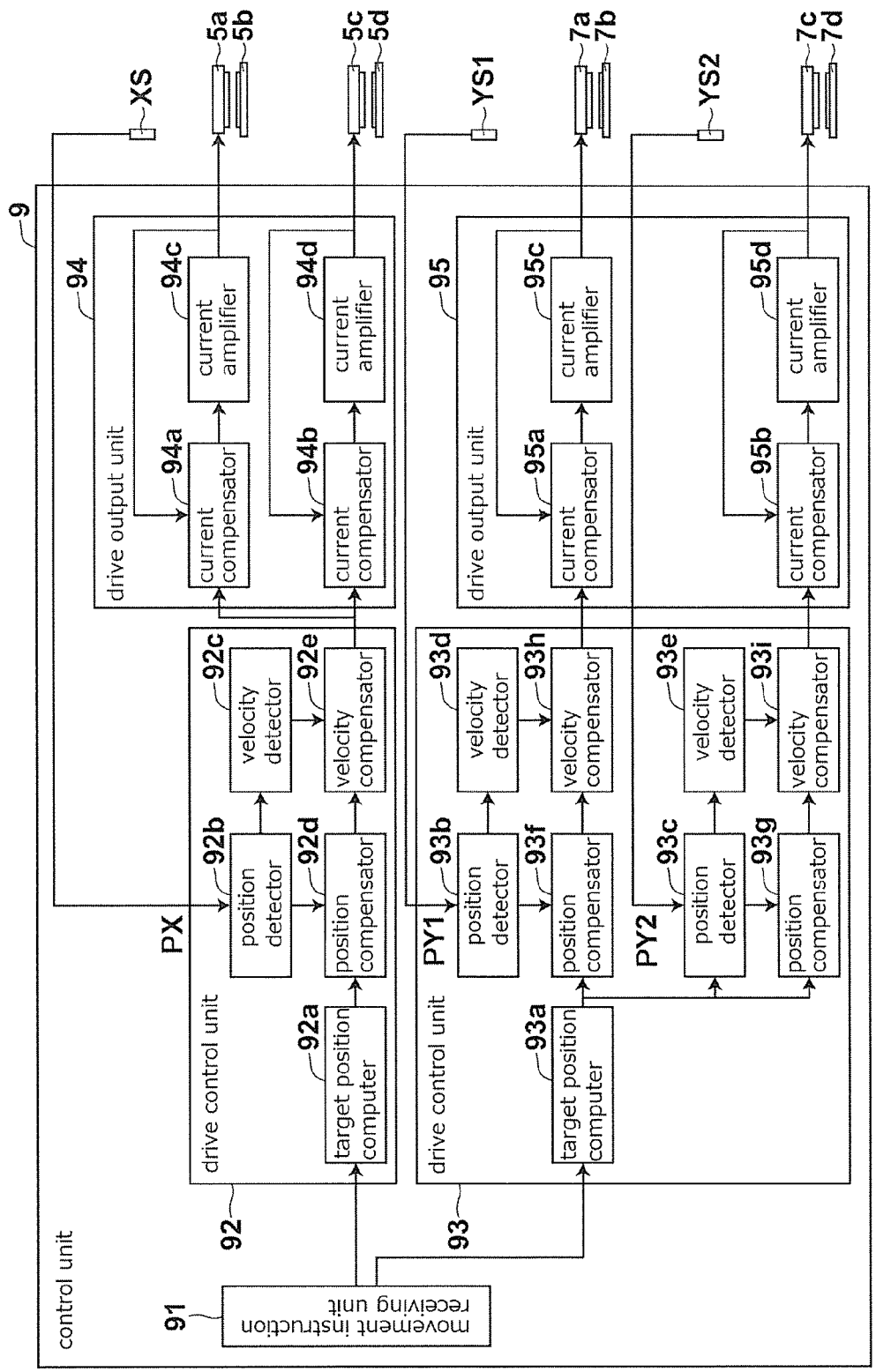
FIG. 5 is a block diagram illustrating a control unit of FIG. 1.

The machine tool 1 includes a control unit 9 that controls the X-axis linear motor 5 and the Y-axis linear motor 7 based on the detected positions of the saddle 3 and the table 4. As illustrated in FIG. 5, the control unit 9 includes a movement instruction receiving unit 91, drive control units 92 and 93, and drive output units 94 and 95.

The movement instruction receiving unit 91 is configured to receive a movement instruction and output a movement command, on the basis of the movement instruction, to the drive control units 92 and 93. For example, an operator may use an operation panel (not shown) to input the movement instruction. The drive control unit 92 and the drive output unit 94 are configured to control the X-axis linear motor 5. The drive control unit 93 and the drive output unit 95 are configured to control the Y-axis linear motor 7.

The X-axis linear encoder XS provides position information PX of the saddle 3 in the X-axis direction to the drive control unit 92. The drive control unit 92 generates a target current for the X-axis linear motor 5 based on the movement command and the position information PX. The drive control unit 92 includes a target position computer 92a, a position detector 92b, a velocity detector 92c, a position compensator 92d, and a velocity compensator 92e.

Based on the movement command, the target position computer 92a computes a target position per unit time and provides the target position to the position compensator 92d. The unit time is determined depending on an operation processing speed of the drive control unit 92. The position detector 92b detects positions of the movers 5a and 5c in the X-axis direction based on the position information PX. The detected positions are provided to the velocity detector 92c and the position compensator 92d.

The velocity detector 92c receives the detected positions per unit time and detects the velocities of the movers 5a and 5c. The detected velocities are provided to the velocity compensator 92e. The position compensator 92d increases an error between the target position and the detected position by a position gain and generates a target velocity. The target velocity is provided to the velocity compensator 92e. The velocity compensator 92e increases an error between the target velocity and the detected velocity and generates the target current. The target current is provided to current compensators 94a and 94b of the drive output unit 94.

The drive output unit 94 provides a drive current to the X-axis linear motor 5 based on the target current. The drive output unit 94 includes the current compensators 94a and 94b and current amplifiers 94c and 94d. The current amplifier 94c receives a current command from the current compensator 94a and provides the drive current to the mover 5a. The drive current of the current amplifier 94c is fed back to the current compensator 94a. The current amplifier 94d receives a current command from the current compensator 94b and provides a drive current to the mover 5c. The drive current of the current amplifier 94d is fed back to the current compensator 94b. The current compensators 94a and 94b generate current commands on the basis of the target current and the drive current.

The Y-axis linear encoder YS1, at a side of the X-axis direction, provides position information PY1 of the table 4 in the Y-axis direction to the drive control unit 93. The Y-axis linear encoder YS2, at the other side of the X-axis direction, provides position information PY2 of the table 4 in the Y-axis direction to the drive control unit 93. Based on the movement command and the position information PY1 and PY2, the drive control unit 93 generates a target current for the Y-axis linear motors 7. The drive control unit 93 includes a target position computer 93a, position detectors 93b and 93c, velocity detectors 93d and 93e, position compensators 93f and 93g, and velocity compensators 93h and 93i.

Based on the movement command, the target position computer 93a computes each target position per unit time and provides the target position to the position compensators 93f and 93g. The position detector 93b detects a position of the mover 7a in the Y-axis direction based on the position information PY1. The position detector 93c detects a position of the mover 7c in the Y-axis direction based on the position information PY2. The target position computer 93a computes each target position in order to make the position information PY1 and PY2 consistent with each other.

The position detector 93b detects the position of the mover 7a in the Y-axis direction based on the position information PY1. The position detector 93c detects the position of the mover 7c in the Y-axis direction based on the position information PY2. The velocity detectors 93d and 93e, the position compensators 93f and 93g, and the velocity compensators 93h and 93i are respectively the same as the velocity detector 92c, the position compensator 92d, and the velocity compensator 92e, and thus details thereof will not be repeated hereinafter.

The drive output unit 95 provides a drive current to the Y-axis linear motors 7 based on the target current. The drive output unit 95 includes current compensators 95a and 95b and current amplifiers 95c and 95d. The current compensators 95a and 95b and the current amplifiers 95c and 95d are respectively the same as the current compensators 94a and 94b and the current amplifiers 94c and 94d. Therefore, details thereof will not be repeated hereinafter.

Referring to FIG. 1, FIG. 2, and FIG. 3 again, an action of the first embodiment is explained below. When the saddle 3 moves in the X-axis direction and the table 4 moves in the Y-axis direction, the table 4 has yawing problem due to the straightness error of the X-axis guide 6 and the Y-axis guide 8. In the figures, the yawing is indicated by arrows.

The table 4 is fixed in the X-axis direction by the rotation bearing 102 attached to the table base 101, and is connected with the bearings 8b and 8c in a way that the table 4 is rotatable around the Z-axis which passes through the center O of the table 4. The control unit 9 controls only the Y-axis linear motor 7 to make the position information PY1 and PY2 consistent with each other, thereby rotating the table 4 in a direction to offset the yawing. Thus, it is not required to detect the yawing amount.

Below a machine tool of the second embodiment of the invention is explained in detail with reference to FIG. 6, FIG. 7, FIG. 8, FIG. 9A, and FIG. 9B. The second embodiment differs from the first embodiment in terms of the connecting unit and the bearings of the Y-axis guides. Components that are the same as those of the first embodiment are assigned with the same reference numerals, and descriptions thereof will be omitted hereinafter.

The Y-axis guide 8 further includes a bearing 8e that is slidably engaged with the guide rail 8a. The bearing 8e is located in the middle of the pair of bearings 8b. The Y-axis guides 8 further include a bearing 8f that is slidably engaged with the guide rail 8c. The bearing 8f is located in the middle of the pair of bearings 8d. The bearings 8e and 8f are located in the center of the table 4 in the Y-axis direction. The bearings 8b, 8d, 8e, and 8f are connected with the bottom surface of the table 4 by a connecting unit 200. The connecting unit 200 includes two fixing spacers 104 and four flexible spacers 105. The two spacers 104 are disposed above the bearings 8e and 8f. The four flexible spacers 105 are disposed above the bearings 8b and 8d.

The bearings 8e and 8f are respectively fixed to the table 4 by the fixing spacers 104. The bearings 8b and 8d are respectively connected with the table 4 by the flexible spacers 105. The flexible spacers 105 allow the table 4 to move in the X-axis direction relative to the bearings 8b and 8d.

Figure 9:
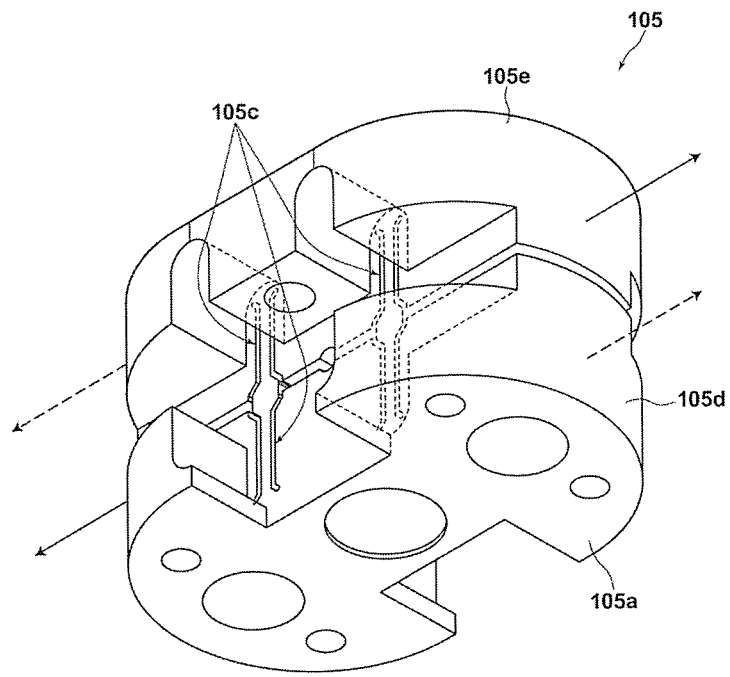
FIG. 9A is a bottom perspective view illustrating a flexible spacer of FIG. 6.
FIG. 9B is a top perspective view illustrating the flexible spacer of FIG. 6.
Figure 9:
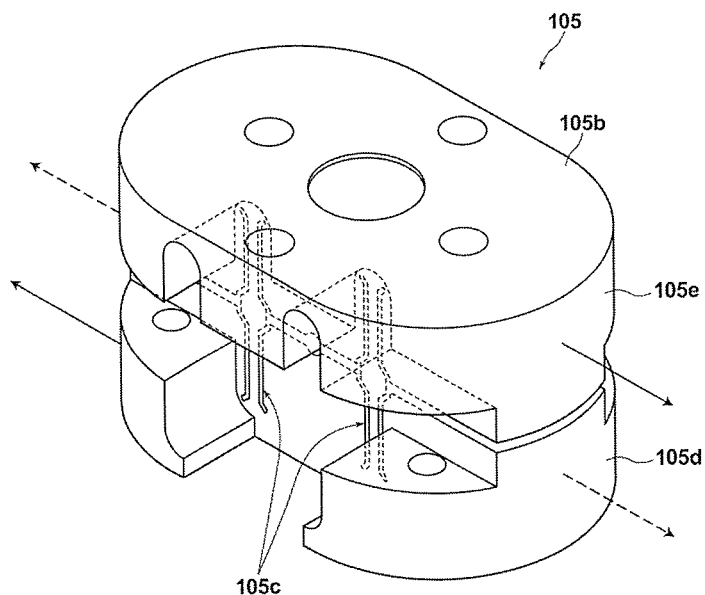

As shown in FIG. 9A and FIG. 9B, the flexible spacer 105 has a bottom 105a attached to the bearings 8b and 8d and a top 105b attached to the table 4. The flexible spacer 105 is divided into an upper part 105e and a lower part 105d by a slit 105c. Moreover, as indicated by the arrows in the figures, with the slit 105c, the upper part 105e and the lower part 105d may be bent to the opposite directions of the X-axis.

Figure 6:
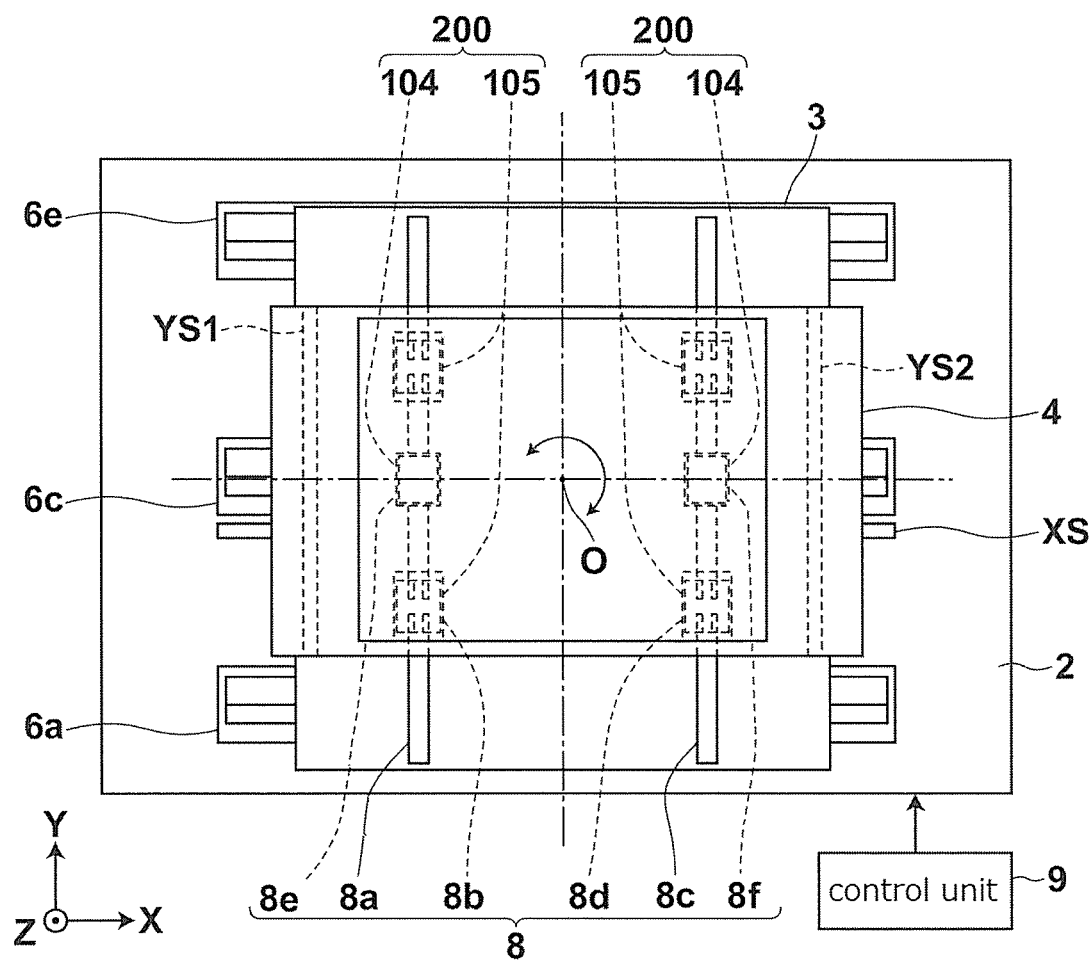
FIG. 6 is a schematic plan view illustrating a machine tool according to the second embodiment of the invention.
Figure 7:
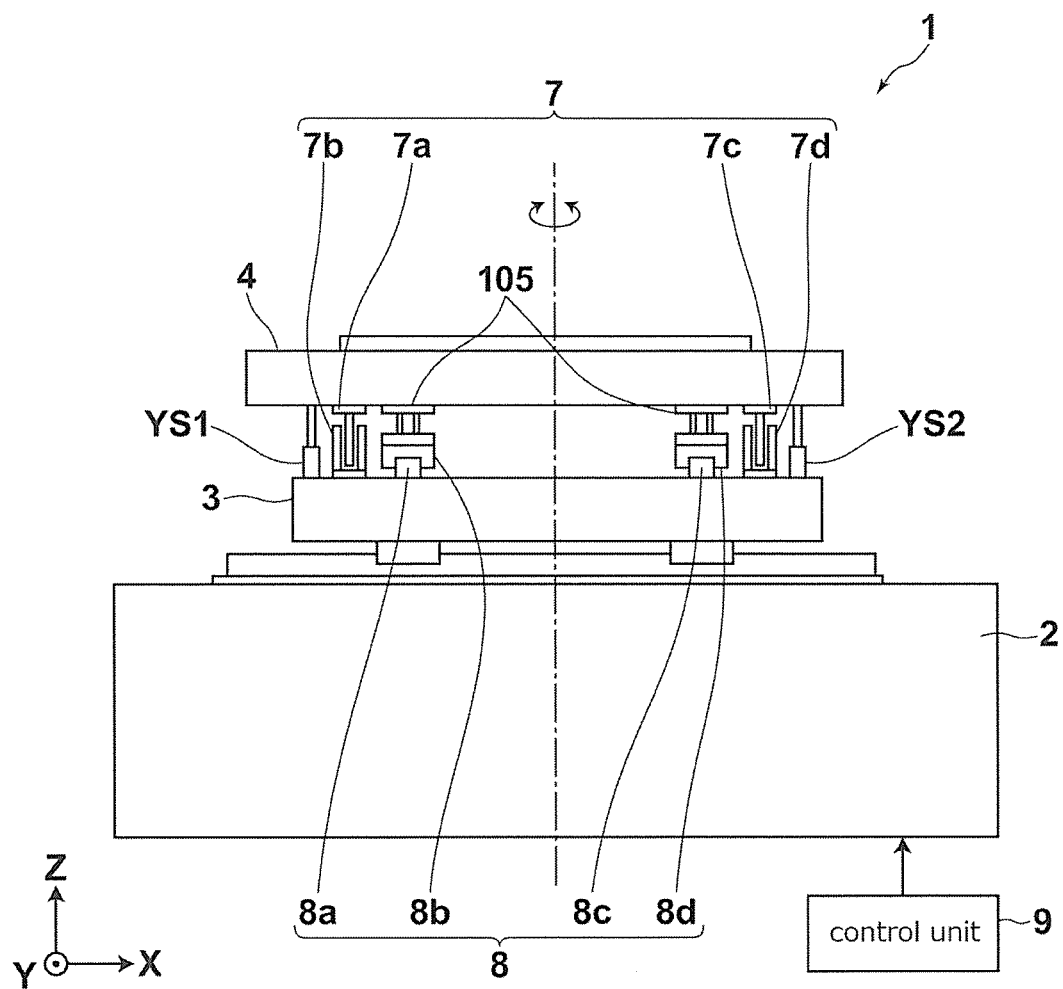
FIG. 7 is a schematic front view illustrating the machine tool of FIG. 6.
Figure 8:
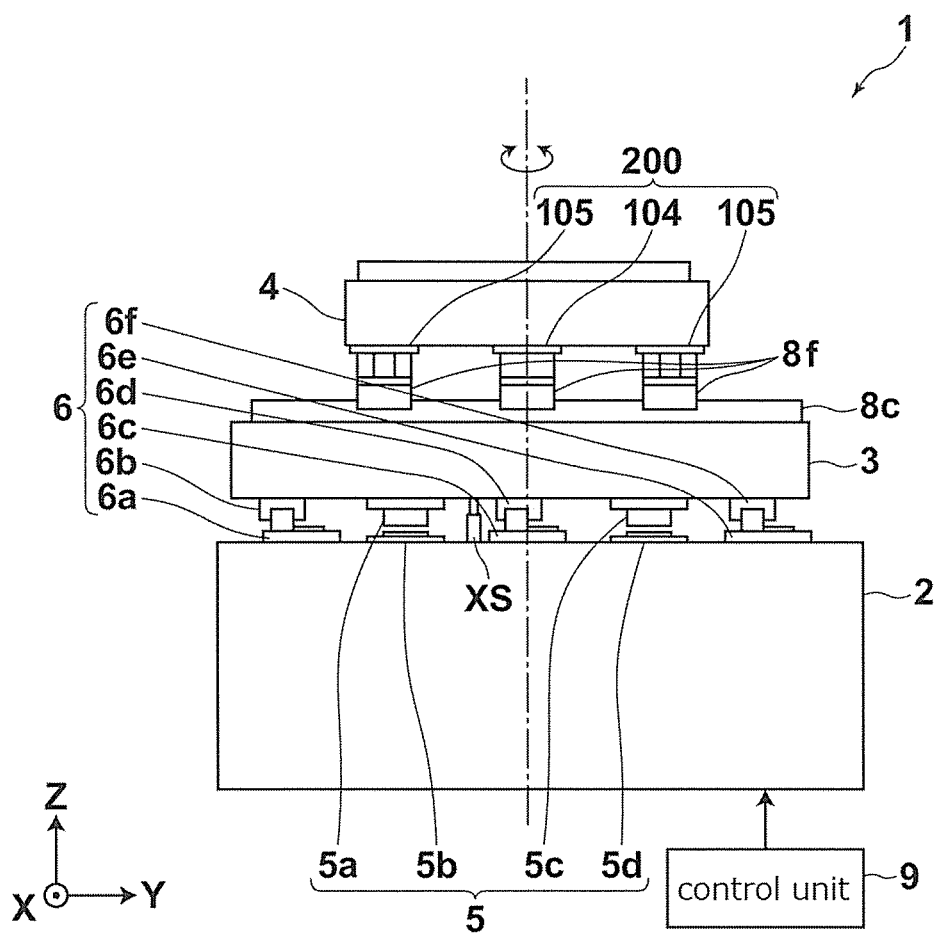
FIG. 8 is a schematic side view illustrating the machine tool of FIG. 6.

Furthermore, please refer to FIG. 6, FIG. 7, and FIG. 8. The table 4 is connected with the bearings 8b and 8d in a state that the table 4 is rotatable around the Z-axis that passes through the center O of the table 4. Accordingly, similar to the first embodiment, the control unit 9 can correct the yawing of the table 4 through the control of the Y-axis linear motors 7. In the second embodiment, the table base 101 may be omitted to reduce the height of the connecting unit. Therefore, the machine tool 1 of the second embodiment has advantages in terms of miniaturization and workability.

Figure 10:
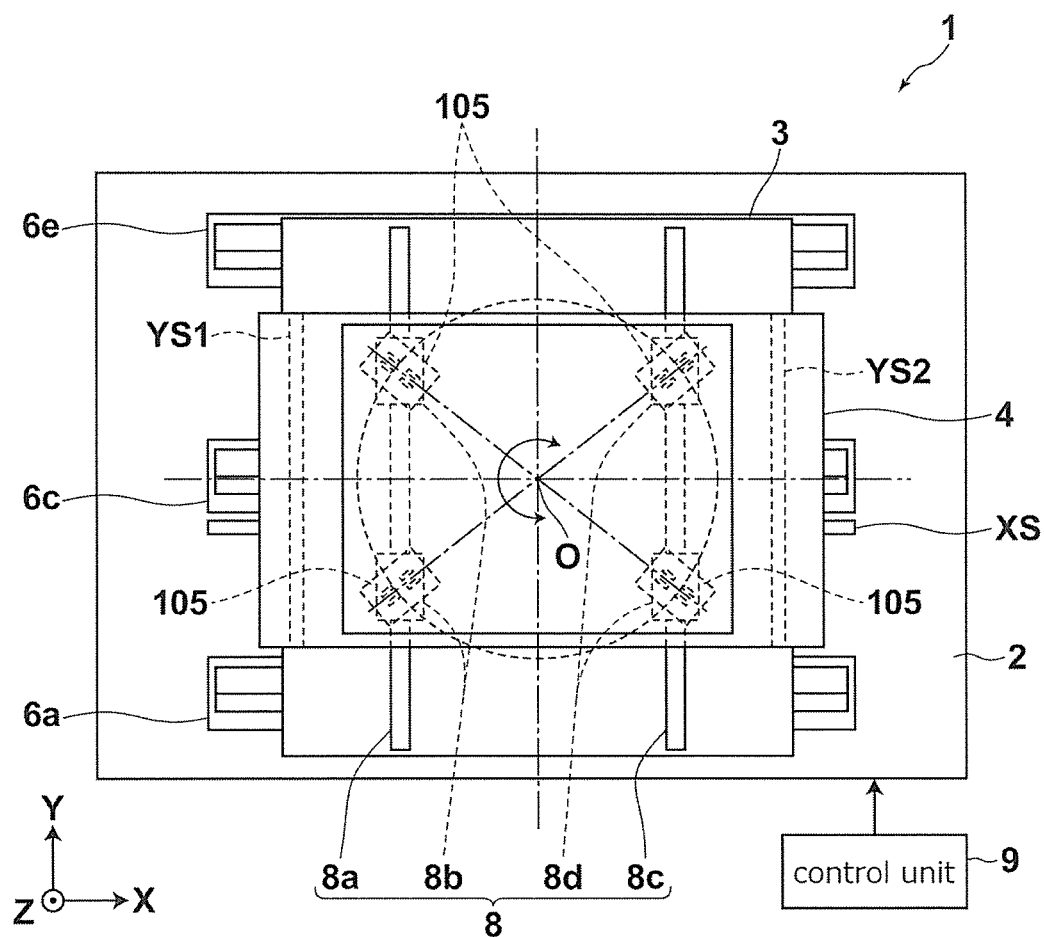
FIG. 10 is a schematic plan view illustrating a machine tool according to the third embodiment of the invention.
Figure 11:
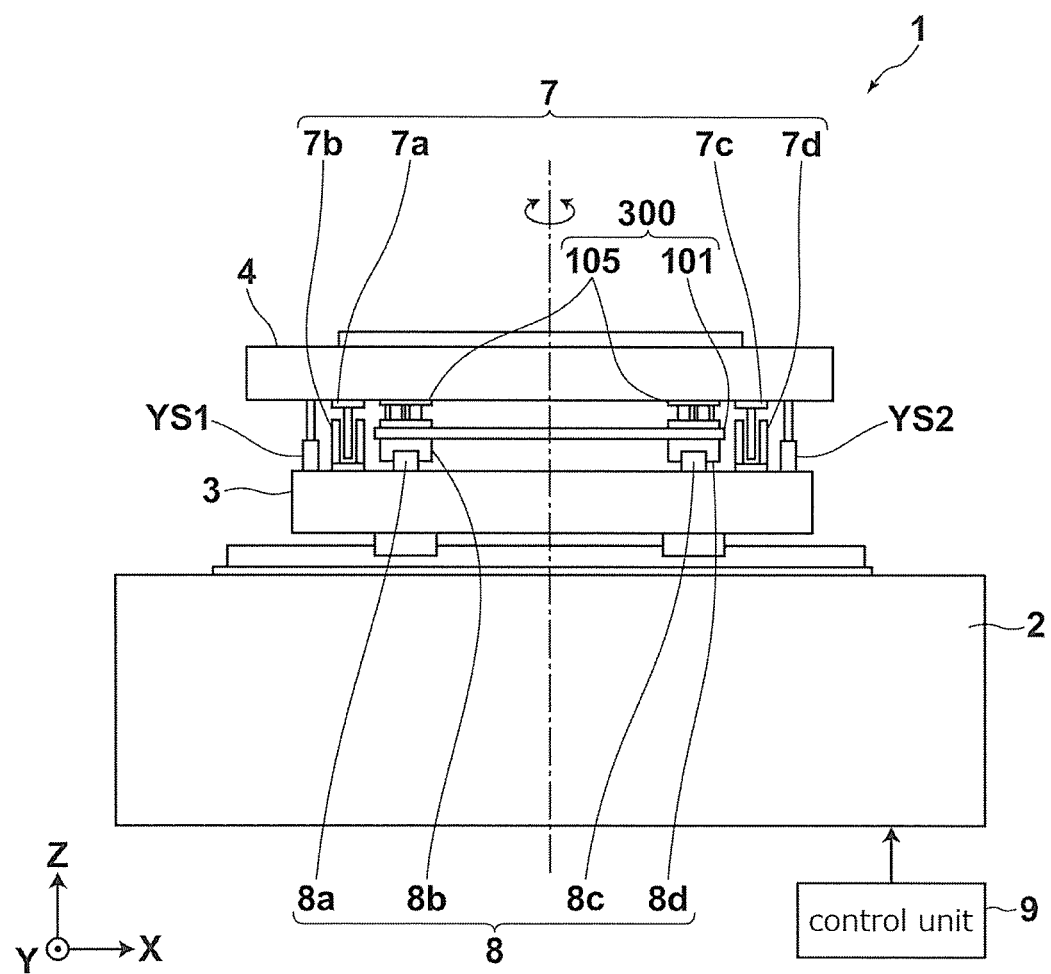
FIG. 11 is a schematic front view illustrating the machine tool of FIG. 10.
Figure 12:
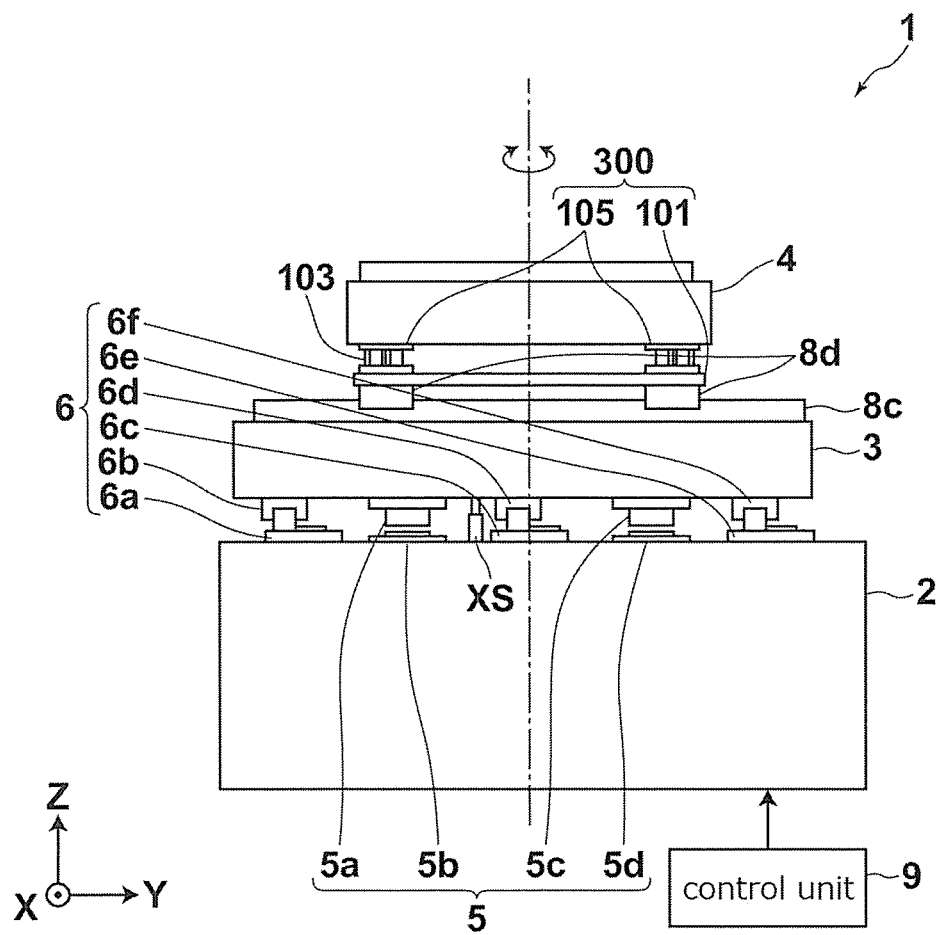
FIG. 12 is a schematic side view illustrating the machine tool of FIG. 10.

A machine tool of the third embodiment of the invention is described in detail below with reference to FIG. 10, FIG. 11, and FIG. 12. The third embodiment differs from the first embodiment in terms of the connecting unit. Components that are the same as those of the first embodiment are assigned with the same reference numerals, and descriptions thereof will be omitted hereinafter.

In the third embodiment, the four rollers 103 of the first embodiment are replaced by four flexible spacers 105. The flexible spacers 105 can be bent in a direction around the center of the table base 101. Accordingly, the bearings 8b and 8d can receive not only the load from above via the table base 101 but also the load in the horizontal direction, and therefore, the rotation bearing 102 of the first embodiment is not required.

The embodiments are described in order to illustrate the spirit of the invention and the practical applications thereof. It should be noted that various modifications may be made with reference to the above descriptions. Thus, the scope of the invention shall be defined by the following claims.

What is claimed is:

1. A machine tool, comprising:
   a saddle movable along a first axis;
   a table disposed on the saddle and movable along a second axis orthogonal to the first axis;
   a first linear motor installed at one side of the saddle along a direction of the first axis and moving the table along the second axis, wherein the first linear motor comprises a first mover and a first stator, the first mover is attached to a bottom surface of the table, and the first stator is attached to a top surface of the saddle, and a predetermined gap is formed between the first mover and the first stator;
   a second linear motor installed in parallel to the first linear motor with an interval therebetween at the other side of the saddle along the direction of the first axis and moving the table along the second axis, wherein the second linear motor comprises a second mover and a second stator, the second mover is attached to the bottom surface of the table, and the second stator is attached to the top surface of the saddle, and a predetermined gap is formed between the second mover and the second stator;
   a first position detector detecting a first position of the table in the second axis at the one side of the saddle along the direction of the first axis;
   a second position detector detecting a second position of the table in the second axis at the other side of the saddle along the direction of the first axis;
   a first guide rail installed at one side of the saddle along the direction of the first axis and extending in a direction of the second axis;
   a second guide rail installed at the other side of the saddle along the direction of the first axis and extending in the direction of the second axis;
   at least two first bearings engaged with the first guide rail;
   at least two second bearings engaged with the second guide rail;
   a connecting unit, wherein the table is fixed to the at least two first bearings and the at least two second bearings in the direction of the first axis through the connecting unit, so that the table is rotatable around a vertical axis relative to the direction of the first axis and the direction of the second axis, and wherein the table is rotatable relative to the saddle by having the connecting unit as a support; and
   a control unit controlling the first linear motor based on the first position and controlling the second linear motor based on the second position.

2. The machine tool according to claim 1, wherein the control unit comprises a target position computer, which generates a target position for the first linear motor and the second linear motor to make the first position and the second position consistent with each other.

3. The machine tool according to claim 1, wherein the connecting unit comprises a table base, which is attached to the at least two first bearings and the at least two second bearings, and a rotation bearing, which connects the table to a center of the table base in a rotatable way.

4. The machine tool according to claim 3, wherein the connecting unit further comprises a roller that is rotatable around the center of the table base.

5. The machine tool according to claim 3, further comprising at least four rollers that are disposed right above the at least two first bearings and the at least two second bearings to sandwich the table base therebetween.

6. The machine tool according to claim 3, wherein the control unit comprises a target position computer, which generates a target position for the first linear motor and the second linear motor to make the first position and the second position consistent with each other.

7. The machine tool according to claim 1, wherein the connecting unit comprises a flexible spacer, which connects the table to the at least two first bearings and the at least two second bearings in a rotatable way.

8. The machine tool according to claim 7, wherein the flexible spacer has a slit for bending the flexible spacer in the direction of the first axis.

9. The machine tool according to claim 7, further comprising a third bearing, which is disposed between the at least two first bearings and engaged with the first guide rail, and a fourth bearing, which is disposed between the at least two second bearings and engaged with the second guide rail, wherein the connecting unit comprises a fixing spacer that fixes the table to the third bearing and the fourth bearing.

10. The machine tool according to claim 7, wherein the control unit comprises a target position computer, which generates a target position for the first linear motor and the second linear motor to make the first position and the second position consistent with each other.

11. The machine tool according to claim 1, wherein the connecting unit comprises a table base, which is attached to the at least two first bearings and the at least two second bearings, and a flexible spacer, which connects the table to the table base in a rotatable way.

12. The machine tool according to claim 11, wherein the flexible spacer has a slit for bending the flexible spacer in a direction around a center of the table base.

13. The machine tool according to claim 11, wherein the control unit comprises a target position computer, which generates a target position for the first linear motor and the second linear motor to make the first position and the second position consistent with each other.

* * * * *